US009893157B1

(12) United States Patent
Feilchenfeld et al.

(10) Patent No.: US 9,893,157 B1
(45) Date of Patent: Feb. 13, 2018

(54) STRUCTURES WITH CONTACT TRENCHES AND ISOLATION TRENCHES

(71) Applicant: GLOBALFOUNDRIES Inc., Grand Cayman (KY)

(72) Inventors: Natalie B. Feilchenfeld, Jericho, VT (US); Michael J. Zierak, Essex Junction, VT (US); Max G. Levy, Essex Junction, VT (US); BethAnn Lawrence, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/401,281

(22) Filed: Jan. 9, 2017

(51) Int. Cl.
| | |
|---|---|
| H01L 29/00 | (2006.01) |
| H01L 29/40 | (2006.01) |
| H01L 21/762 | (2006.01) |
| H01L 23/522 | (2006.01) |
| H01L 21/768 | (2006.01) |
| H01L 29/10 | (2006.01) |
| H01L 23/532 | (2006.01) |
| H01L 27/12 | (2006.01) |
| H01L 29/78 | (2006.01) |

(52) U.S. Cl.
CPC ...... *H01L 29/407* (2013.01); *H01L 21/76283* (2013.01); *H01L 21/76802* (2013.01); *H01L 23/5226* (2013.01); *H01L 23/53271* (2013.01); *H01L 27/1207* (2013.01); *H01L 29/107* (2013.01); *H01L 29/1087* (2013.01); *H01L 29/7824* (2013.01)

(58) Field of Classification Search
CPC . H01L 29/407; H01L 29/107; H01L 29/1087; H01L 29/7824; H01L 21/76283; H01L 21/76802; H01L 23/5226; H01L 23/53271; H01L 27/1207
USPC .......................................................... 257/501
See application file for complete search history.

(56) References Cited

U.S. PATENT DOCUMENTS

| | | | |
|---|---|---|---|
| 5,217,920 | A | 6/1993 | Mattox et al. |
| 5,314,841 | A | 5/1994 | Brady et al. |
| 5,382,541 | A | 1/1995 | Bajor et al. |
| 5,504,033 | A | 4/1996 | Bajor et al. |
| 6,251,734 | B1 | 6/2001 | Grivna et al. |
| 7,549,927 | B2 | 6/2009 | Haile et al. |
| 8,963,281 | B1 * | 2/2015 | Blair .................. H01L 29/0649 257/301 |
| 9,324,632 | B2 | 4/2016 | Feilchenfeld et al. |
| 2015/0348870 | A1 * | 12/2015 | Feilchenfeld ......... H01L 21/743 257/506 |

* cited by examiner

*Primary Examiner* — Tu-Tu Ho
(74) *Attorney, Agent, or Firm* — Thompson Hine LLP; Anthony Canale

(57) ABSTRACT

Structures that include contact trenches and isolation trenches, as well as methods for forming structures including contact trenches and isolation trenches. A contact trench is formed that extends through a device layer of a silicon-on-insulator (SOI) substrate to a buried oxide layer of the SOI substrate. An isolation trench is formed that extends through the device layer to the buried oxide layer. An electrical insulator is deposited that fills the contact trench and the first isolation trench. The electrical insulator is removed from the contact trench. After the electrical insulator is removed from the contact trench, an electrical conductor is formed in the contact trench. The electrical contact may be coupled with a doped region in a handle wafer of the SOI substrate.

20 Claims, 4 Drawing Sheets

US 9,893,157 B1

STRUCTURES WITH CONTACT TRENCHES AND ISOLATION TRENCHES

BACKGROUND

The present invention relates to semiconductor device fabrication and integrated circuits and, more specifically, to structures that include contact trenches and isolation trenches, as well as methods for forming structures including contact trenches and isolation trenches.

Devices fabricated using semiconductor-on-insulator (SOI) technologies may exhibit certain performance improvements in comparison with comparable devices built directly in a bulk silicon substrate. Generally, a SOI substrate includes a device layer of semiconductor material, a handle wafer, and a buried oxide or BOX layer physically separating and electrically isolating the device layer from the handle wafer. Integrated circuits may be fabricated using the semiconductor material of the device layer.

High-voltage integrated circuits typically require specialized circuit technology capable of withstanding substantial voltages. In order to maintain standard well implants prevalent in complementary-metal-oxide semiconductor (CMOS) technologies and to provide a sufficient volume of semiconductor material to provide a drift region of laterally-diffused metal-oxide-semiconductor (LDMOS) device structure, a relatively thick device layer may be desired.

Improved structures that include contact trenches and isolation trenches, as well as methods for forming structures including contact trenches and isolation trenches, are needed.

SUMMARY

In an embodiment of the invention, a structure includes an isolation region in a first trench extending through a device layer of a silicon-on-insulator (SOI) substrate to a buried oxide layer of the SOI substrate, a handle wafer contact in a second trench extending through the device layer and the buried oxide layer to a handle wafer of the SOI substrate, and a doped region in the handle wafer. The first isolation region is comprised of an electrical insulator. The handle wafer contact is comprised of an electrical conductor. The handle wafer contact is coupled with the doped region in the handle wafer.

In an embodiment of the invention, a method that includes forming a contact trench extending through a device layer of a silicon-on-insulator (SOI) substrate to a buried oxide layer of the SOI substrate, and forming an isolation trench extending through the device layer to the buried oxide layer. An electrical insulator is deposited that fills the contact trench and the first isolation trench. The electrical insulator is removed from the contact trench. After the electrical insulator is removed from the contact trench, an electrical conductor is formed in the contact trench.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
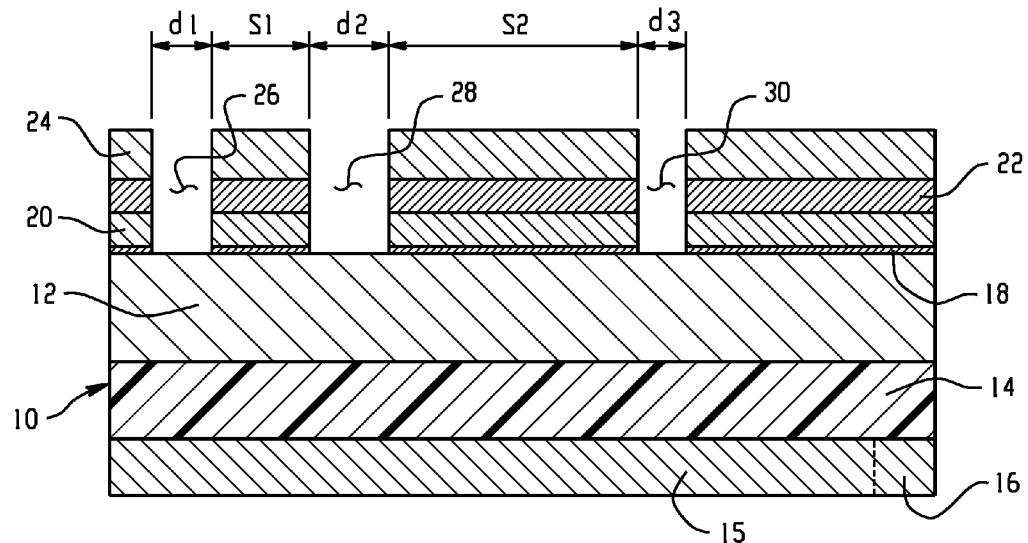
FIGS. 1-6 are cross-sectional views of a portion of a substrate at successive stages of a processing method in accordance with embodiments of the invention.

With reference to FIG. 1 and in accordance with an embodiment of the invention, an semiconductor-on-insulator (SOI) substrate 10 includes a device layer 12, a buried dielectric layer in the form of a buried oxide (BOX) layer 14 comprised of an oxide of silicon (e.g., $SiO_2$), and a handle wafer 16. The device layer 12 is separated and electrically insulated from the handle wafer 16 by the intervening BOX layer 14, and is considerably thinner than the handle wafer 16. The thickness of the device layer 12 may be selected to be thin enough to allow implantation of the handle wafer 16, but also thick enough to support the fabrication of complementary metal-oxide-semiconductor (CMOS) device structures. The device layer 12 and the handle wafer 16 may be comprised of a single crystal semiconductor material, such as silicon. The BOX layer 14 has a surface in direct contact with a top surface of the handle wafer 16 along an interface and another surface in direct contact with a bottom surface of the device layer 12 along an interface, and these surfaces are separated by the thickness of the BOX layer 14 that extends to the rim of the SOI substrate 10.

In an embodiment, a region 15 of the handle wafer 16 may be modified to reduce its electrical resistance by the addition of an electrically-active dopant. A mask (not shown) may be applied and lithographically patterned to define an opening aligned with the location for the doped region 15 in the handle wafer 16. The mask may include a photoresist layer that is patterned by exposure to a pattern of radiation from an exposure source projected through a photomask, and developed with a chemical developer to form an opening over an area that is situated at the intended location for the region 15. The region 15 may be doped by introducing a suitable p-type or n-type dopant using, for example, ion implantation in the presence of the mask. The region 15 may be used as a bottom gate or field plate located below an overlying SOI region of the device layer 12, and may be used to enhance the performance of a device structure formed using the SOI region.

Pad layers 18, 20 are located on a top surface of the device layer 12. Pad layer 18 may be comprised of a dielectric material, such as silicon dioxide ($SiO_2$) grown by wet or dry oxidation of the device layer 12 or deposited by chemical vapor deposition (CVD). Pad layer 20 is formed on the top surface of the pad layer 18, and may be comprised of a dielectric material, such as silicon nitride ($Si_3N_4$) deposited by CVD. A dielectric layer 22 is formed on the pad layer 20 and may be comprised of a dielectric material, such as silicon dioxide ($SiO_2$) deposited by CVD.

Openings 26, 28, 30 are formed that extend vertically through the pad layers 18, 20 and the dielectric layer 22 to the top surface of the device layer 12. To that end, a patterned mask layer 24 is formed on the top surface of the dielectric layer 22. The mask layer 24 may be comprised of, for example, a photoresist material that is applied by a spin coating process, pre-baked, exposed to a radiation projected through a photomask, baked after exposure, and developed with a chemical developer to define openings 26, 28, 30. Alternatively, the mask layer 24 may be a hardmask that is patterned using a patterned photoresist pattern such that the dimensional control over the pattern transfer is improved.

The dimensions and spacings of the openings 26, 28, 30 may be selected according to predetermined parameters. For example, opening 26 is separated from opening 28 by a distance, S1, opening 28 is separated from opening 30 by a distance, S2, opening 28 has a dimension, d2, opening 26 has a dimension, d1, that is less than the dimension of opening 28, and opening 30 has a dimension, d3, that is less than the dimensions of openings 16, 28. These dimensions may be measured in a direction transverse to a depth of penetration from the top surface of the device layer 12 vertically into and through the device layer 12. For example, the width of opening 26 may be chosen to be equal to one-half (i.e., 50%) of the width chosen for each of the opening 28.

The openings 26, 28, 30 may be extended vertically by one or more etching processes through the pad layers 18, 20 and the dielectric layer 22 to the top surface of the device layer 12 in order to form a hard mask. Each etching process, which may be a reactive ion etching (RIE) process conducted in a single etching step or multiple etching steps with different etch chemistries, removes the materials of the layers 18, 20, 22 at the locations of the openings 26, 28, 30. The openings 26, 28, 30 may extend vertically to a shallow depth into the device layer 12 as the result of over-etching. The openings 26, 28 surround a perimeter of a portion of the SOI substrate 10 that may be utilized to form one or more high-voltage devices. The mask layer 24 may be removed following the formation of the openings 26, 28, 30.

Figure 2:
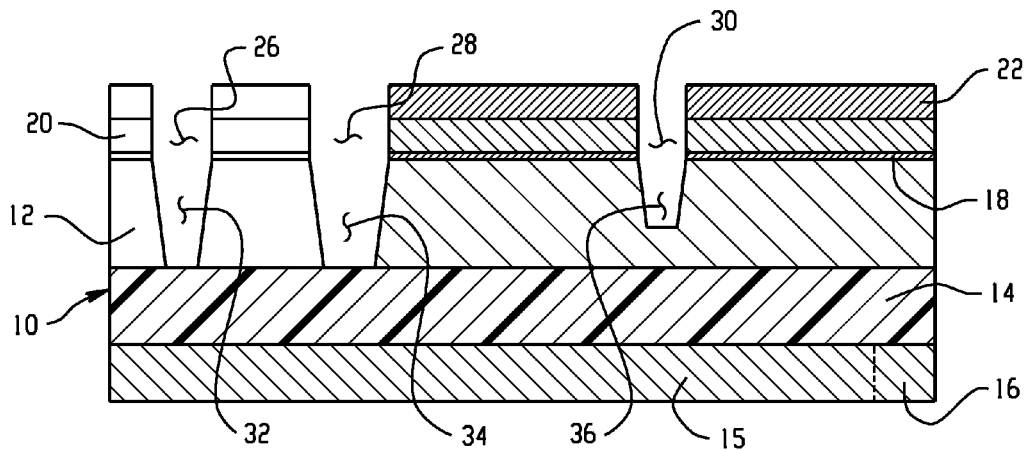

With reference to FIG. 2 in which like reference numerals refer to like features in FIG. 1 and at a subsequent fabrication stage, a contact trench 32, an isolation trench 34, and a shallow isolation trench 36 are formed as openings in the device layer 12. The trenches 32, 34, 36 are aligned with the openings 26, 28, 30 previously formed in the overlying layers 18, 20, 22, which operate as an etch mask. The trenches 32, 34, similar to their predecessor openings 26, 28, surround an outer perimeter of a portion of the SOI substrate 10 that may subsequently be utilized to form one or more high-voltage device structures.

The contact trench 32 and isolation trench 34 penetrate through the device layer 12 so as to intersect the BOX layer 14, and interrupt the continuity of the device layer 12, and are used, when filled, to electrically isolate the surrounded portion of the SOI substrate 10 from the remainder of the SOI substrate 10 outside its outer perimeter. The shallow isolation trench 36 penetrates only partially through the device layer 12, and is used to provide shallow trench isolation.

The trenches 32, 34, 36 may be simultaneously formed by an etching process, which may be a RIE process conducted with a given etch. The etching process may be selected to stop on the material of the BOX layer 14. In particular, the etch chemistry may be selected to remove the constituent semiconductor material of the device layer 12 selective to the material constituting the BOX layer 14. As used herein, the term "selective" in reference to a material removal process (e.g., etching) denotes that the material removal rate (e.g., etch rate) for the targeted material is higher than the removal rate for at least another material exposed to the material removal process. A wet chemical clean may be performed to remove by-products of the etching process from inside the openings 26, 28, 30.

The dimensions and spacings of the trenches 32, 34, 36 are directly related to the dimensions and spacings of the openings 26, 28, 30 formed initially in the mask layer 24 and subsequently in the layers 18, 20, 22. Simultaneous formation of the contact trench 32, the isolation trench 34, and the shallow isolation trench 36 with reliance upon the same mask layer 24 permits the relative positions of the trenches 32, 34, 36 to be well-defined and the trenches 32, 34, 36 to be self-aligned with respect to each other, in contrast with the result of a masked etching process to form the contact trench 32 and different masked etching processes to form the isolation trench 34 and the shallow isolation trench 36.

The contact trench 32 is separated from the isolation trench 34 by the distance, S1, and the isolation trench 34 is separated from the shallow isolation trench 36 by the distance, S2. The contact trench 32 may have a width or dimension at the top surface of the device layer 12 that is equal to the dimension, d1, the isolation trench 34 may have a width or dimension at the top surface of the device layer 12 that is equal to the dimension, d2, of opening 28, and the shallow isolation trench 36 may have a width or dimension at the top surface of the device layer 12 that is equal to the dimension, d3, of opening 30. The sidewalls of the trenches 32, 34, 36 may taper with increasing penetration depth into the device layer 12. However, in a horizontal plane at any given depth in the device layer 12 at a location between the top surface of the device layer 12 and its interface with the BOX layer 14, the width of the contact trench 32 is less than the width of the isolation trench 34. The width of the shallow isolation trench 36 is less than the width of the contact trench 32 or the width of the isolation trench 34. The relatively narrow width of the opening 30 leads to the penetration of the shallow isolation trench 36 only part way through the device layer 12.

Figure 3:
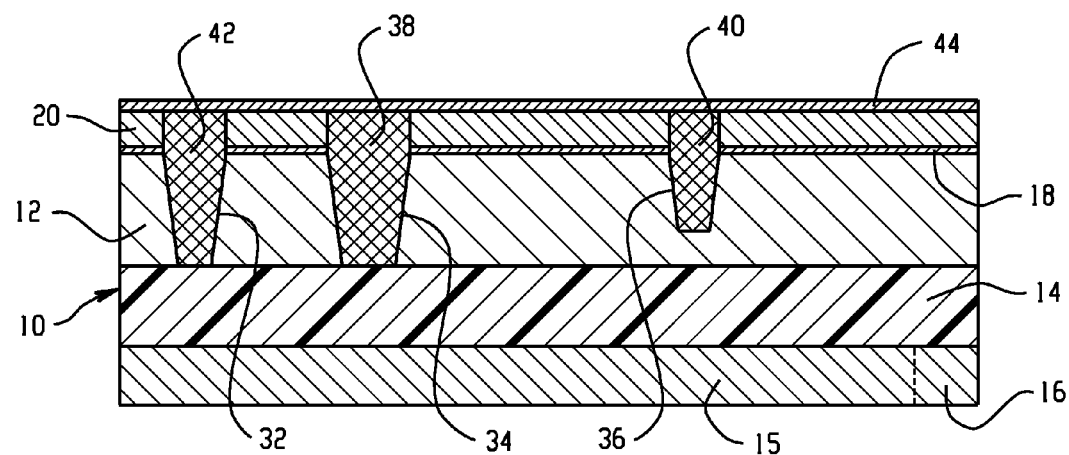

With reference to FIG. 3 in which like reference numerals refer to like features in FIG. 2 and at a subsequent fabrication stage, an isolation region 38 is formed in the trench 34 and a shallow trench isolation region 38 is formed in the trench 36 by filling with an electrical insulator. The contact trench 32 may be temporarily filled with a portion 42 of the same electrical insulator. The isolation region 38, which conforms to the shape of the trench 34, extends through the device layer 12 to the BOX layer 14, and is included in the final device structure. The shallow trench isolation region 40, which conforms to the shape of the trench 36, extends partially through the device layer 12, and is included in the final device structure.

To form the isolation region 38 in trench 34, shallow trench isolation region 40 in trench 36, and the portion 42 of electrical insulator in contact trench 32, an electrical insulator may be deposited with a given thickness and planarized relative to the top surface of the pad layer 20 using, for example, chemical mechanical polishing (CMP) and/or etch-back. The electrical insulator may be an oxide of silicon (e.g., silicon dioxide) deposited by CVD and, in an embodiment, may be a high-aspect-ratio process (HARP) oxide film deposited by sub-atmospheric chemical vapor deposition utilizing tetraethylorthosilicate (TEOS) and ozone as reactant gases. The deposited electrical insulator conforms to the geometrical shape of the trenches 32, 34, 36. After polishing, the embedded electrical insulator in the trenches 32, 34, 36 forms the isolation region 38, the shallow trench isolation region 40, and the portion 42 in contact trench 32.

A hardmask layer 44 may be formed on the top surface of the pad layer 20. The hardmask layer 44 may be a layer of silicon dioxide ($SiO_2$) deposited by CVD. The hardmask layer 44 may subsequently function in the process flow as an etch stop layer.

Figure 4:
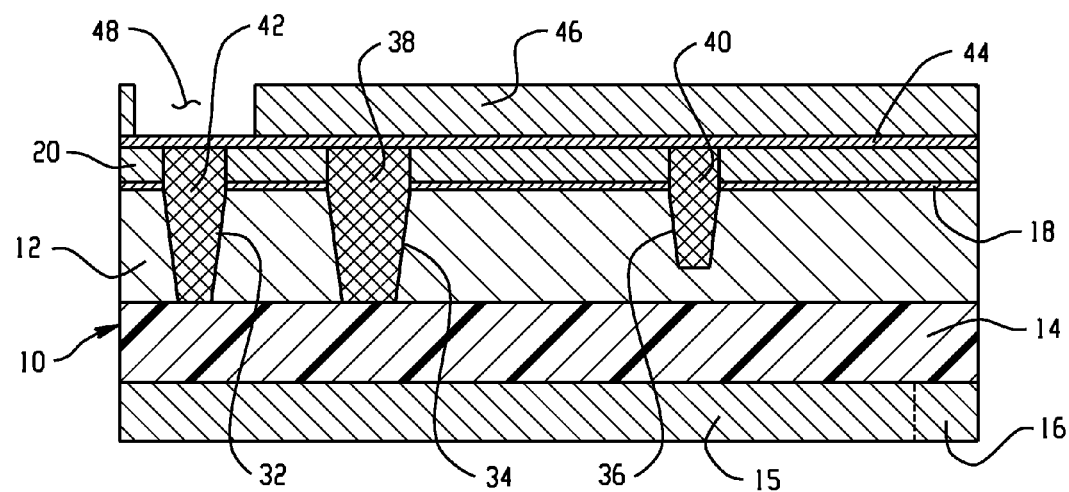

With reference to FIG. 4 in which like reference numerals refer to like features in FIG. 3 and at a subsequent fabrication stage, a mask layer 46 is applied to the top surface of the hardmask layer 44 and patterned to form an opening 48 that penetrates through its thickness. The mask layer 46 may be composed of, for example, a photoresist material that is applied by a spin coating process, pre-baked, exposed to a radiation projected through a photomask, baked after exposure, and developed with a chemical developer to define the opening 48. The opening 48 may have a dimension, d4, that is greater than the dimension, d1, of opening 26 and the related dimension of contact trench 32 now filled with the portion 42 of electrical insulator. For example, the width of opening 48 may be chosen to be equal to twice the width (i.e., 200%) chosen for the opening 26. The increased dimension of the opening 48, in comparison with the corresponding dimension of the opening 26, relaxes the requirements for precise overlay when the mask layer 46 is patterned.

Figure 5:
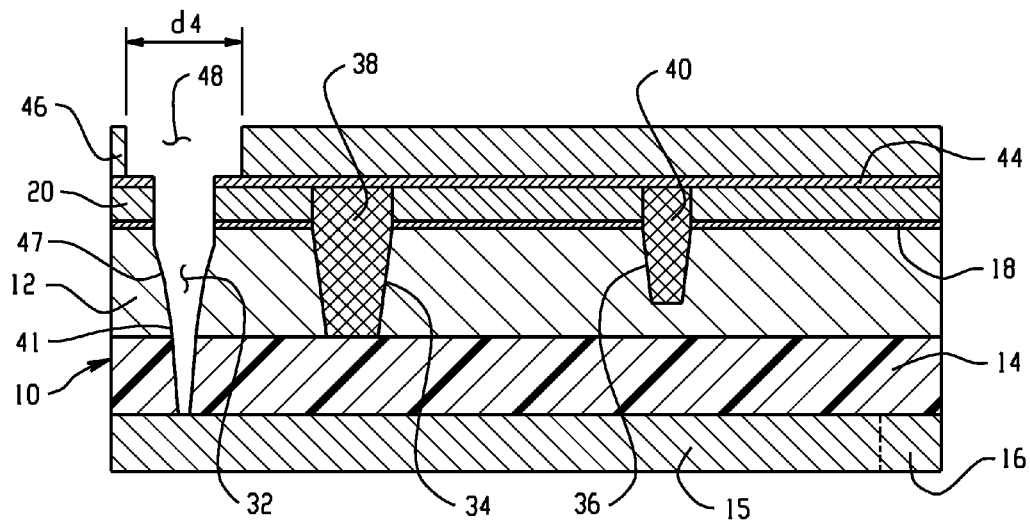

With reference to FIG. 5 in which like reference numerals refer to like features in FIG. 4 and at a subsequent fabrication stage, the portion 42 of electrical insulator residing in contact trench 32 is removed from the contact trench 32. After the portion 42 of electrical insulator is removed, the contact trench 32 is subsequently extended through the BOX layer 14 to the interface between the BOX layer 14 and the handle wafer 16. The extended contact trench 32 penetrates through the device layer 12 and the BOX layer 14 so as to intersect the handle wafer 16. The extension of the contact trench 32 to the handle wafer 16 is accomplished without disturbing the integrity of the isolation regions 38, 40 in the trenches 34, 36. That is, the isolation region 38 in trench 34 and the shallow trench isolation region 40 in trench 36 are covered and protected by the mask layer 46 when the contact trench 32 is reopened and extended through the BOX layer 14.

An etching process may be used to reopen the contact trench 32, which is aligned with the opening 48 in mask layer 46, by removing the portion 42 of electrical insulator and then extending the contact trench 32 with continued etching through the thickness of the BOX layer 14. The etching process may be continuous in that the removal of portion 42 and the extension of the contact trench 32 into the BOX layer 14 may be performed without interruption. The etching process, which may be a wet chemical etch process or a dry (e.g., RIE) etch process, is conducted with a given etch chemistry that removes the materials of the portion 42 and BOX layer 14 selective to the material of the handle wafer 16 and stops on the handle wafer 16 at the interface between the BOX layer 14 and handle wafer 16. For example, the etch chemistry may be a buffered hydrofluoric acid solution (BHF) that removes silicon dioxide constituting the BOX layer 14 and the portion 42 of electrical insulator selective to silicon constituting the device layer 12 and handle wafer 16. By-products of the etching process may be removed from the contact trench 32 by a wet chemical clean.

Because the etching process merely removes the portion 42 of electrical insulator positioned inside the contact trench 32, the device layer 12 is only subjected to a single etching process when the contact trench 32 is extended through the BOX layer 14. In other words, the semiconductor material of the device layer 12 is not itself etched to a significant extent during the etching process with the possible exception of a shape change proximate to the interface between the device layer 12 and the BOX layer 14.

The extended contact trench 32 has dual-tapered shape with non-vertical sidewalls that arises at least in part from the dimension of the opening 48 in mask layer 46 being greater than the dimension, d1, of the opening 26 in mask layer 24. Specifically, the extended contact trench 32 has a section 47 in which the sidewalls are inclined relative to vertical to converge with a taper angle, and a section 49 in which the sidewalls are inclined relative to vertical to converge with a taper angle that is greater than the taper angle of section 47. Section 49 is located between section 47 and the handle wafer 16.

Figure 6:
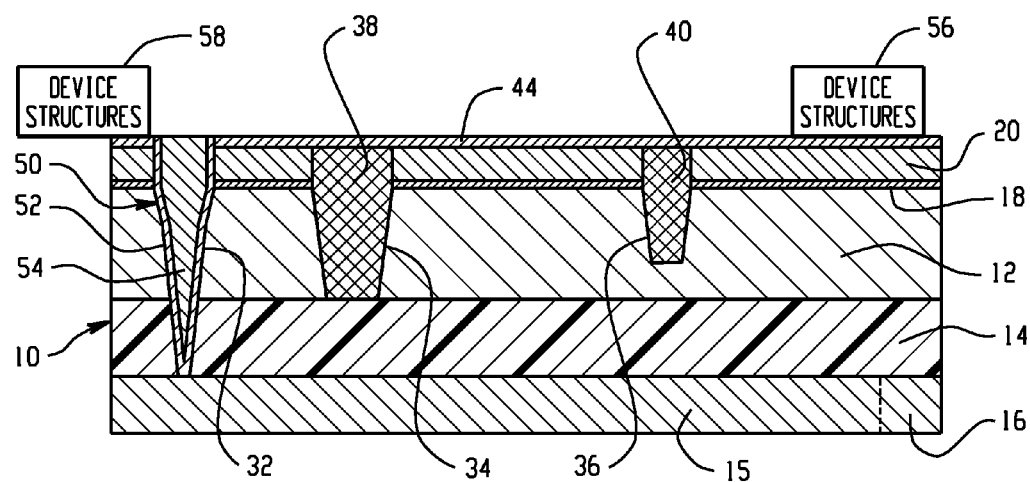

With reference to FIG. 6 in which like reference numerals refer to like features in FIG. 5 and at a subsequent fabrication stage, a handle wafer contact 50 may be formed in the extended contact trench 32. Because of the self-aligned manner in which the trenches 32, 34, 36 are formed, the handle wafer contact 50 the isolation region 38, and the shallow trench isolation region 40 are likewise self-aligned with each other. The handle wafer contact 50 provides a vertical electrical connection with the handle wafer 16 and, more specifically, a vertical electrical connection with the region 15 of the handle wafer 16 that is comprised of semiconductor material having the same conductivity type as the handle wafer contact 50.

Figure 7:
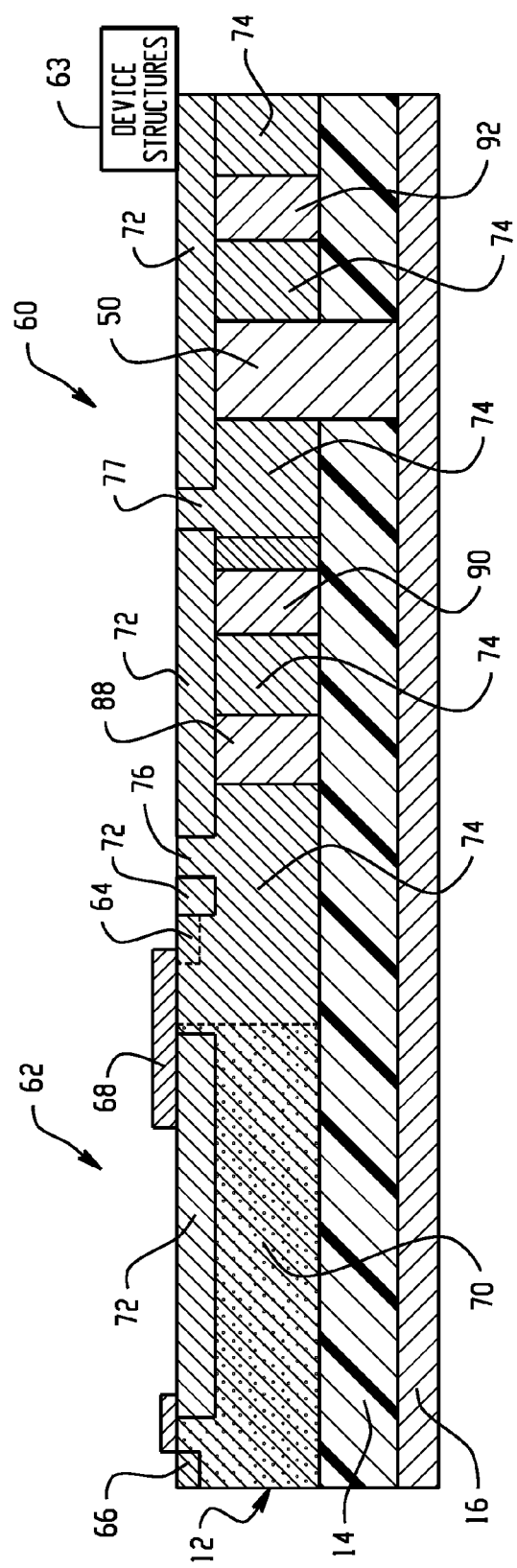
FIG. 7 is a cross-sectional view of a portion of a substrate in accordance with embodiments of the invention.

The handle wafer contact 50 is accessible at the top surface of the device layer 12 in order to couple the handle wafer contact 50 with conductive features subsequently formed in a BEOL structure. For example, the handle wafer contact 50 may be coupled at the top surface of the device layer 12 with conductive features in the BEOL structure that are connected with a ground potential. As another example, the handle wafer contact 50 may be coupled with the region 15 of the handle wafer 16 as part of a device structure, such as a field plate that may be used to shield a drift region of a laterally-diffused metal-oxide-semiconductor (LDMOS) transistor (FIG. 7).

The handle wafer contact 50 may have a composite construction that includes multiple layers 52, 54. The layer 52 is formed on the sidewall surfaces of the contact trench 32. The layer 52 may be deposited by low-pressure chemical vapor deposition (LPCVD), and may be comprised of a semiconductor material, such as intrinsic polysilicon. The layer 52 may be doped by introducing a suitable p-type or n-type dopant using, for example, ion implantation. The electrically-active dopant that is introduced into the layer 52 may have the same conductivity type as the dopant present in the region 15 of the handle wafer 16. In an embodiment, the layer 52 may be doped with an n-type dopant from Group V of the Periodic Table (e.g., phosphorus (P), arsenic (As), or antimony (Sb)) in a concentration effective to impart a designated n-type conductivity. The dual-tapering of the extended contact trench 32 with inclined sidewalls in sections 47 and 49 promotes the ability to use ion implantation to dope the layer 52 and thereby reduce its electrical resistivity to provide a low ohmic contact between the region 15 in the handle wafer 16 and the top surface of the device layer 12.

The layer 54 may fill the remaining space inside the contact trench 32 that is not occupied by the layer 52. In an embodiment, the layer 54 may be constituted by a semiconductor material, such as intrinsic polysilicon, deposited by CVD. When the dopant of layer 52 is electrically activated by an anneal, the handle wafer contact 50 may exhibit a reduced electrical resistance. In an alternative embodiment, the handle wafer contact 50 may be formed by depositing a semiconductor material in contact trench 32 that is in situ doped during deposition, instead of implanted, to furnish the reduced electrical resistance.

One or more device structures 56 of one type may be formed using a region of the substrate 10, and one or more device structures 58 of another type may be formed using a different region of the substrate 10. The isolation regions 38, 40 and the handle wafer contact 50, which surround the substrate portion that includes the device structures 56, are located between the device structures 56 and the device structures 58. In an embodiment, the device structures 56 may be high-voltage CMOS device structures, such as LDMOS transistors and the device structures 58 may include low-voltage CMOS device structures, such as field-effect transistors. The handle wafer contact 50 may be used to apply a bias voltage to the region 15. As a result, the region 15 may be used as a bottom gate or field plate for a device structure.

The integration of the processing required to form the contact trench 32 for the handle wafer contact 50, the trench 34 for the isolation region 38, and the trench 36 for the shallow trench isolation region 40 may provide both cost and chip area reductions. In an embodiment, this integrated processing may be merged with a process forming shallow trench isolation, which may provide additional process sharing and cost/chip size reductions. In addition, the self-aligned trenches 32, 34, 36 may be formed in the SOI substrate 10 without the use of an epitaxial grown top silicon layer.

With reference to FIG. 7 in which like reference numerals refer to like features in FIG. 6 and in accordance with an embodiment, a structure 60 includes a high-voltage device structure 62 that is integrated with low-voltage device structures 63 into a CMOS chip formed using the SOI substrate 10. The high-voltage device structure 62 may comprise, for example, an LDMOS transistor that includes a source 64, a drain 66, a gate structure 68, and a drift region 70. Low-voltage device structures 63 that are formed in a region of the SOI substrate 10 adjacent to the high-voltage device structure 62.

The structure 60 includes multiple isolation regions 88, 90 similar to isolation region 38 and the handle wafer contact 50, which are situated horizontally between the high-voltage device structure 62 and the low-voltage device structures 63. Each of the isolation regions 88, 90 functions to drop a fixed amount of voltage (e.g., 50 volts) that is interrelated with the operating voltage of the high-voltage device structure 62. The number of isolation regions 88, 90 may vary contingent upon the voltage level that is to be dropped. For example, an operating voltage of 50 volts to 100 volts in the region of the high-voltage device structure 62 will require at least two isolation regions 88, 90 each capable of dropping a fixed voltage of 50 volts in order to provide high-voltage isolation, and an operating voltage exceeding 100 volts will require additional isolation regions.

In this instance, the trench in which the handle wafer contact 50 is formed has a larger dimension (e.g., width) than the corresponding dimension (e.g., width) of the isolation regions 88, 90. The handle wafer contact 50 is still formed using an oversized opening in an applied resist layer when removing the electrical insulator from its trench and extending its trench into the BOX layer 14, as discussed above in connection with patterned mask layer 46 and the etching process discussed in the context of FIGS. 3 and 4. Shallow trench isolation (STI) regions 72 are formed in the device layer 12 in the self-aligned manner as described above in conjunction with the formation of the isolation regions 88, 90 and the handle wafer contact 50.

A body region 74 is located in the device layer 12. A contact region 76 is used to couple the body region 74 and a contact region 77 is used to couple the handle wafer contact 50 with contacts formed by middle-of-line (MOL) processing. The handle wafer contact 50 is located beneath one of the STI regions 72, and the contact region 77 provides access at the top surface of the device layer 12 for contacting the handle wafer contact 50.

An additional isolation region 80 may be formed outside of the perimeter defined by the handle wafer contact 50 that surrounds the structure 60. The isolation region 92 is constructed and formed in the same manner as the isolation regions 88, 90, and may be self-aligned with isolation regions 88, 90, the STI regions 72, and the handle wafer contact 50.

The isolation regions 88, 90, 92 and the handle wafer contact 50, as well as the pattern of trenches used to form them, may be customized to accommodate different high-voltage device designs. In particular, the layout for the trenches for the isolation regions 88, 90, 92 and the handle wafer contact 50 may be used to generate a parameterized cell (PCell) with electronic design automation (EDA) software. The PCell represents a part or component of a circuit in which the structure represented by the isolation regions 88, 90, 92, the STI regions 72, and the handle wafer contact 50 is dependent on one or more input parameters. Different instances of the PCell may be parameterized based on different user-defined values of the input parameters. Input parameters may include, but are not limited to, the width of the isolation regions 88, 90 and their trenches, the width of the handle wafer contact 50 and its trench, the distances between the isolation regions 88, 90 and the STI regions 72, the optional inclusion of the isolation region 92, etc. Through the adjustment of these and other input parameters, the physical dimensions and/or configuration of the structure are tunable.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
forming a contact trench extending through a device layer of a silicon-on-insulator (SOI) substrate to a buried oxide layer of the SOI substrate;
forming a first isolation trench extending through the device layer to the buried oxide layer;
depositing an electrical insulator that completely fills the contact trench and the first isolation trench;
removing the electrical insulator from the contact trench; and
after the electrical insulator is removed from the contact trench, forming an electrical conductor in the contact trench.

2. The method of claim 1 wherein removing the electrical insulator from the contact trench comprises:
extending the contact trench through the buried oxide layer to a handle wafer of the SOI substrate.

3. The method of claim 2 wherein the handle wafer includes a doped region, and the electrical conductor in the contact trench is coupled with the doped region.

4. The method of claim 2 wherein the contact trench includes non-vertical sidewalls that extend through the buried oxide layer to the handle wafer, and forming the electrical conductor in the contact trench further comprises:
depositing a first semiconductor layer on the non-vertical sidewalls of the contact trench that partially fills the contact trench;
implanting the first semiconductor layer with an electrically-active dopant; and
after implanting the first semiconductor layer, depositing a second semiconductor layer that fills the remaining space inside the contact trench that is not occupied by the first semiconductor layer,
wherein the first semiconductor layer provides an ohmic contact between the handle wafer and the device layer.

5. The method of claim 1 further comprising:
masking the first isolation trench when the electrical insulator is removed from the contact trench.

6. The method of claim 1 wherein the contact trench has a first width, the first isolation trench has a second width, the contact trench is spaced from the first isolation trench by a distance, and the first width, the second width, and the distance are scalable by a selection of input parameters to instantiate a PCell including the first isolation trench and the contact trench.

7. The method of claim 1 wherein the contact trench and the first isolation trench are concurrently formed by an etching process using respective openings in a mask layer.

8. The method of claim 1 wherein the contact trench is formed by an etching process using an opening in a first patterned mask, and removing the electrical insulator from the contact trench comprises:
forming a second patterned mask layer having an opening that is larger in size than the opening in the first patterned mask.

9. The method of claim 8 wherein the second patterned mask layer covers the electrical insulator in the first isolation trench when the electrical insulator is removed from the contact trench.

10. The method of claim 1 further comprising:
forming a high-voltage device structure using a portion of the device layer,
wherein the contact trench and the first isolation trench surround the portion of the device layer.

11. The method of claim 10 wherein the first isolation trench is located between the contact trench and the high-voltage device structure.

12. The method of claim 1 further comprising:
forming a second isolation trench extending partially through the device layer; and
filling the second isolation trench with the electrical insulator that is deposited to fill the contact trench and the first isolation trench,
wherein the electrical insulator in the second isolation trench defines a shallow trench isolation region.

13. The method of claim 12 wherein the contact trench, the first isolation trench, and the second isolation trench are concurrently formed by an etching process using respective openings in a mask layer, and the opening in the mask layer used to form the second isolation trench is narrower than the opening in the mask layer used to form the first isolation trench and the opening in the mask layer used to form the contact trench.

14. The method of claim 1 wherein the electrical insulator is completely removed from the contact trench.

15. The method of claim 1 wherein the contact trench has a width, and the first isolation trench has a width that is less than the width of the contact trench.

16. The method of claim 8 wherein removing the electrical insulator from the contact trench comprises:
extending the contact trench through the buried oxide layer to a handle wafer of the SOI substrate.

17. The method of claim 16 wherein the contact trench includes non-vertical sidewalls that extend through the buried oxide layer to the handle wafer, and forming the electrical conductor in the contact trench further comprises:
depositing a first semiconductor layer on the non-vertical sidewalls of the contact trench that partially fills the contact trench;
implanting the first semiconductor layer with an electrically-active dopant; and
after implanting the first semiconductor layer, depositing a second semiconductor layer that fills the remaining space inside the contact trench that is not occupied by the first semiconductor layer,
wherein the first semiconductor layer provides an ohmic contact between the handle wafer and the device layer.

18. The method of claim 8 further comprising:
masking the first isolation trench when the electrical insulator is removed from the contact trench.

19. The method of claim 8 wherein the contact trench has a first width, the first isolation trench has a second width, the contact trench is spaced from the first isolation trench by a distance, and the first width, the second width, and the distance are scalable by a selection of input parameters to instantiate a PCell including the first isolation trench and the contact trench.

20. The method of claim 8 wherein the contact trench and the first isolation trench are concurrently formed by an etching process using respective openings in a mask layer.

* * * * *